United States Patent
Chang et al.

(10) Patent No.: US 8,034,654 B2
(45) Date of Patent: Oct. 11, 2011

(54) METHOD FOR FORMING A GEXSI1-X BUFFER LAYER OF SOLAR-ENERGY BATTERY ON A SILICON WAFER

(75) Inventors: Edward Yi Chang, Hsinchu (TW); Shih-Hsuan Tang, Hsinchu (TW); Yue-Cin Lin, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 148 days.

(21) Appl. No.: 12/461,175

(22) Filed: Aug. 4, 2009

(65) Prior Publication Data

US 2010/0129956 A1 May 27, 2010

(30) Foreign Application Priority Data

Nov. 21, 2008 (TW) .............................. 97145032 A

(51) Int. Cl.
*H01L 21/00* (2006.01)
(52) U.S. Cl. ................... 438/93; 438/57; 257/E27.123; 257/E27.124; 257/E27.125

(58) Field of Classification Search .................... 438/48, 438/57, 93, 94, 96, 481, 482, 483, 506, 514, 438/766; 257/E27.123, E27.124, E27.125, 257/E25.007, E21.09
See application file for complete search history.

(56) References Cited

U.S. PATENT DOCUMENTS

2008/0314444 A1* 12/2008 Kawaguchi ................ 136/256
2010/0006143 A1* 1/2010 Welser ........................ 136/255

OTHER PUBLICATIONS

Hsieh et al., "Use of Si+ pre-ion-implantation on Si substrate to enhance the strain relaxation of the GexSi1-x metamorphic buffer layer for the growth of Ge layer on Si substrate", Applied Physics Letters 90, Feb. 2007, pp. 083507-1 to 083507-3.*

* cited by examiner

*Primary Examiner* — Michael Lebentritt
*Assistant Examiner* — Daniel Whalen
(74) *Attorney, Agent, or Firm* — Bacon & Thomas, PLLC

(57) ABSTRACT

The method is disclosed that $Si^+$ is implanted on Si substrate to enhance strain relaxation at the interface between the metamorphic $Ge_xSi_{1-x}$ buffer layers and Si substrate, in order to facilitate the growth of a high quality Ge on Si substrate. And several $Ge_xSi_{1-x}$ buffer layers ($Si/Ge_{0.8}Si_{0.2}/Ge_{0.9}Si_{0.1}/Ge$) are grown on top of Si substrate by UHVCVD. Then grow pure Ge layer of low dislocation density on $Ge_xSi_{1-x}$ buffer layer. Finally, grow up high efficiency III-V solar cell on $Ge_xSi_{1-x}$ buffer layer.

2 Claims, 7 Drawing Sheets

METHOD FOR FORMING A GEXSI1-X BUFFER LAYER OF SOLAR-ENERGY BATTERY ON A SILICON WAFER

BACKGROUND OF THE INVENTION

1. Field of the Invention

The invention relates to a method for forming a $Ge_xSi_{1-x}$ buffer layer, particularly to a method for forming a $Ge_xSi_{1-x}$ buffer layer of solar-energy battery on a silicon wafer.

2. Description of the Prior Art

The germanium-based (Ge) as a base substrate of InGaP/InGaAs/GaAs/Ge solar cell has become the main structure of III-V triple-junction solar cell, since the emergence of high-efficiency III-V triple-junction solar cell facing the world. In other words, these solar cells are composed of the gallium arsenide (GaAs) material system. At present, a lot of materials can be matched with the GaAs lattice, such as InGaAsP, InGaAlP, and AlGaAs etc. The growth technology of these materials is very mature, which is used by the industry widely. Due to these materials own the larger energy gap, they are able to be used on the junction with energy gap greater than GaAs. When the energy gap is smaller than GaAs, except germanium, it is very difficult to find other mature materials which can match with the GaAs lattice.

In the conventional GaAs solar cell fabrication process, the Metal Organic Chemical Vapor Deposition (MOCVD) is usually employed to deposit the Ge layer, InGaP layer, InGaAs layer, and the buffer layers sequentially on the germanium substrate by series packing, finally the electrodes and anti-reflect layers are coated on both ends of above-mentioned layers to form the finished product of solar cell. The absorption spectrum distribution and power generation efficiency of solar cell will be influenced by the composed elements of every conjunction layer, the lattice matching of every epitaxial layer, and the quality of crystal-type, in order to fabricate the high-efficiency solar cell that is best the lattice matching and the best energy gap distribution, also, the composed elements of every conjunction layer, the lattice matching of every epitaxial layer, and the quality of crystal-type will often become the key-point of bottleneck and fabrication yield for the technological development of solar cell.

Thus in the conventional technological area of solar energy, the germanium substrate is collected. The III-V semiconductors are grown on the germanium substrate. The total weight is relatively heavy, and the price of germanium substrate is quite higher as well. The maximum size of germanium substrate is only 4 inches, and it is unable to produce larger product. Thus the cost of Ge-based solar cell cannot be reduced for the industrial requirement.

In addition, the conventional method usually use $Si_{1-x}Ge_x$ (x=0~1) to grow the germanium on the silicon wafer. This method has the shortcomings, such as thicker SiGe buffer layer (up to about 10 μm), higher manufacturing cost and difficult fabrication process integration. And the surface of Ge will be rougher due to the generation of cross hatch pattern.

Thus in order to respond the demand for the related technology of solar cell, it is necessary to develop relevant technologies of solar cell, to save the cost of manpower and time, and to form the high-efficiency solar cell.

SUMMARY OF THE INVENTION

The invention does not use the germanium substrate of conventional solar cell technology but the GaAs is deposited on the silicon substrate to form the solar cell instead. The ion implantation method is used to reduce the stress between the silicon wafer and the SiGe epitaxial layer. Then the SiGe buffer layer is grown on the silicon substrate. Furthermore, the Ge thin layer is grown on the SiGe buffer layer, and the solar cell structure is grown on the Ge layer.

The invention can lighten the weight of the solar cell. The invention can be grown on larger silicon wafer (above six inches), which can reduce the cost greatly.

The invention uses the $Si^+$ implanted Si substrate to enhance the strain relaxation at the interface between the Si substrate and the SiGe epitaxial layer.

The invention grows the SiGe buffer layer on the Si substrate, and uses the generated stress field between the interface to block the formation and penetration of dislocations, in order to reduce the dislocation density of the SiGe epitaxial layer.

The invention uses the Si substrate as the substrate of III-V solar cell, which can raise the mechanical property of the solar energy chip effectively, in order to reduce the manufacturing cost and lighten the weight of the solar cell.

The invention can raise the light concentration folds of the solar cell, adjust the interface of different materials, and raise the conversion efficiency.

The invention can make the flexible solar cell, the main characteristics are the followings:

It can be used as energy gap material directly, it can absorb sunlight effectively. The conversion efficiency of multiple-junction solar cell is up to 39%. It can still maintain good operation feature at the environment of high temperature. It is suitable to be used under the light concentration condition.

The advantage and spirit of the invention can be understood further by the following detail description of invention and attached Figures.

BRIEF DESCRIPTION OF THE DRAWINGS

The foregoing aspects and many of the attendant advantages of this invention will become more readily appreciated as well becomes better understood by reference to the following detailed description, when taken in conjunction with the accompanying drawings, wherein.

DESCRIPTION OF THE PREFERRED EMBODIMENT

The invention uses the silicon substrate instead of the conventional Ge substrate, and uses P-type SiGe as the buffer layer. The P-type substrate is used as the positive electrode, and the contact material of P-type electrode is combined at both ends to form the solar cell.

Figure 1A:
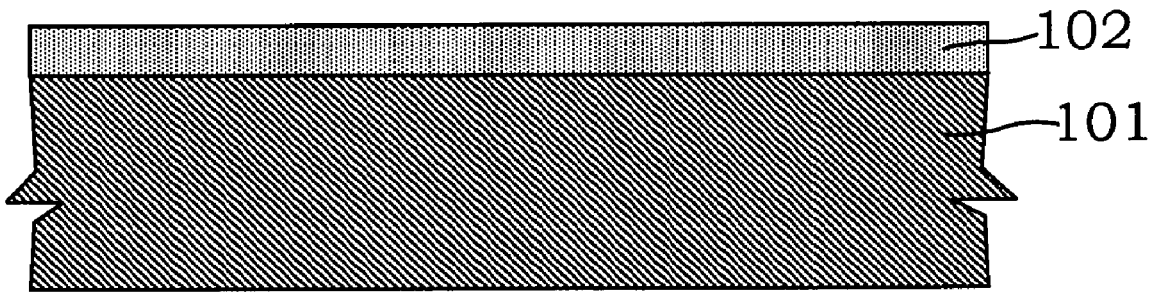
FIG. 1A to FIG. 1E show a preferred embodiment of the invention.

As shown in FIG. 1A, a method for forming a GeSi buffer layer of solar-energy battery on a silicon wafer is illustrated. Provide a silicon substrate 101 firstly. The silicon substrate 101 is a P-type substrate, which can be used as the positive electrode. The $Si^+$ implantation method is used to form a $Si^+$ implantation layer 102 on the silicon substrate 101. The purpose is to upset the lattice of the silicon substrate 101, to facilitate the growth of relaxed SiGe layers in the next step.

Figure 1B:
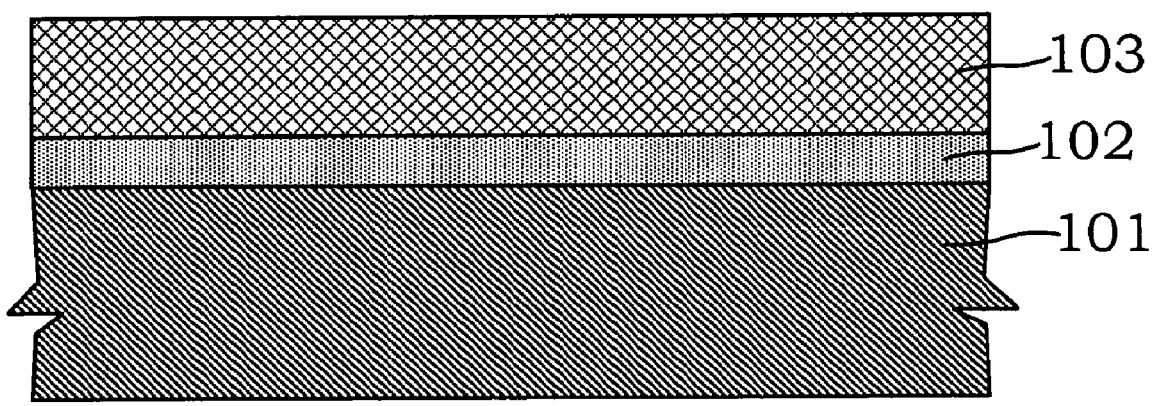

As shown in FIG. 1B, the Ultra High Vacuum Chemical Vapor Deposition (UHVCVD) is used to grow the first relaxed SiGe layer 103 (also called as the SiGe buffer layer 103) on the Si$^+$ implantation layer 102. It is the doping p plus (p$^+$) layer, and its growth condition is 450° C. and 30 mTorr.

Figure 1C:
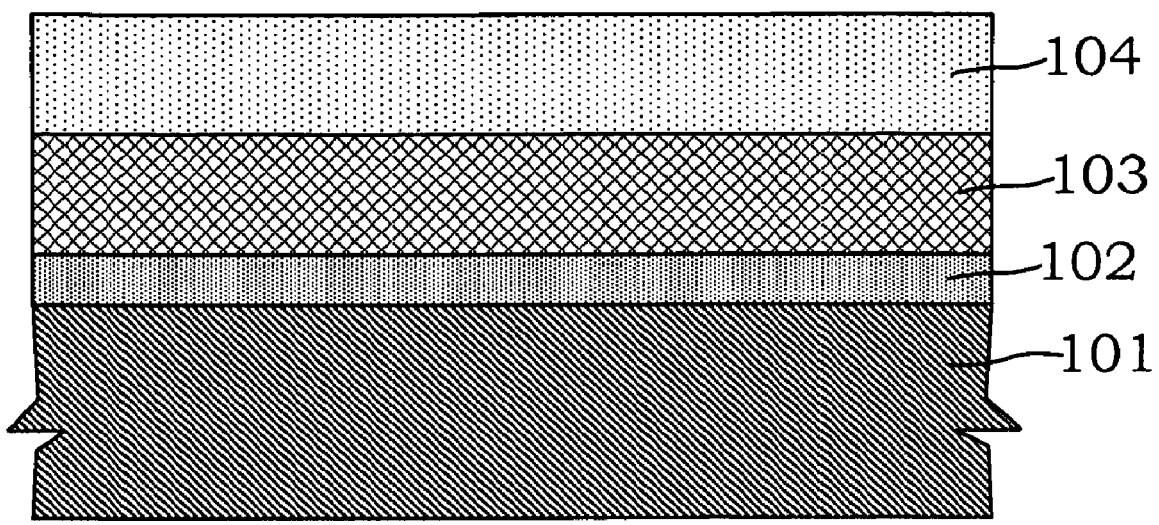

As shown in FIG. 1C, the Ultra High Vacuum Chemical Vapor Deposition (UHVCVD) is used to grow the second relaxed SiGe layer 104 (also called as the SiGe buffer layer 104) on the first relaxed SiGe layer 103. It is the doping p plus (p$^+$) layer, and its growth condition is 450 □ and 30 mTorr.

Figure 1D:
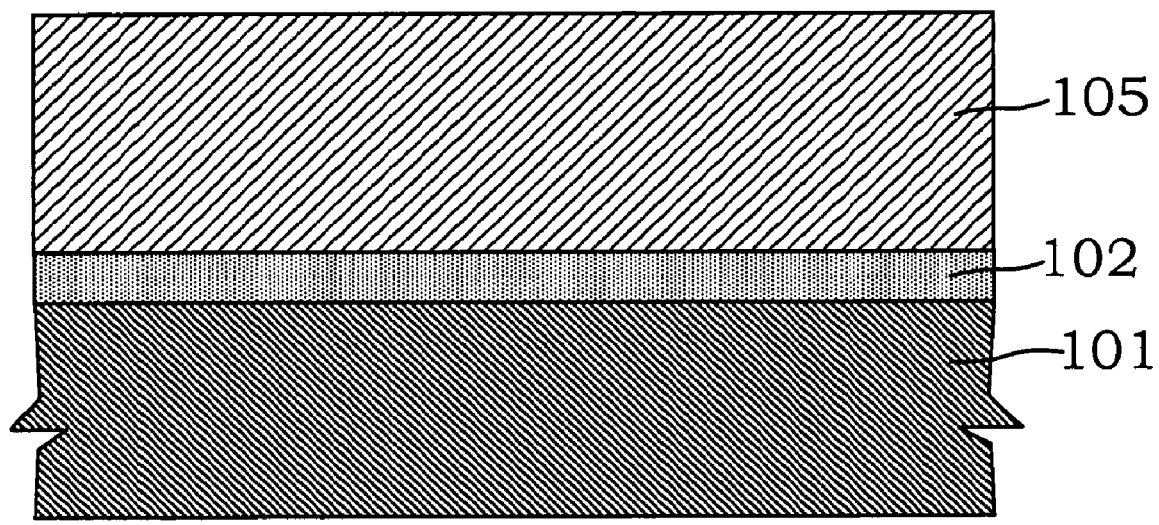

As shown in FIG. 1D, the first relaxed SiGe layer 103 and the second relaxed SiGe layer 104 can be combined to as a layer, which is called the relaxed SiGe layer 105 or the SiGe buffer layer 105. It is the doping p plus (p$^+$) layer.

Figure 1E:
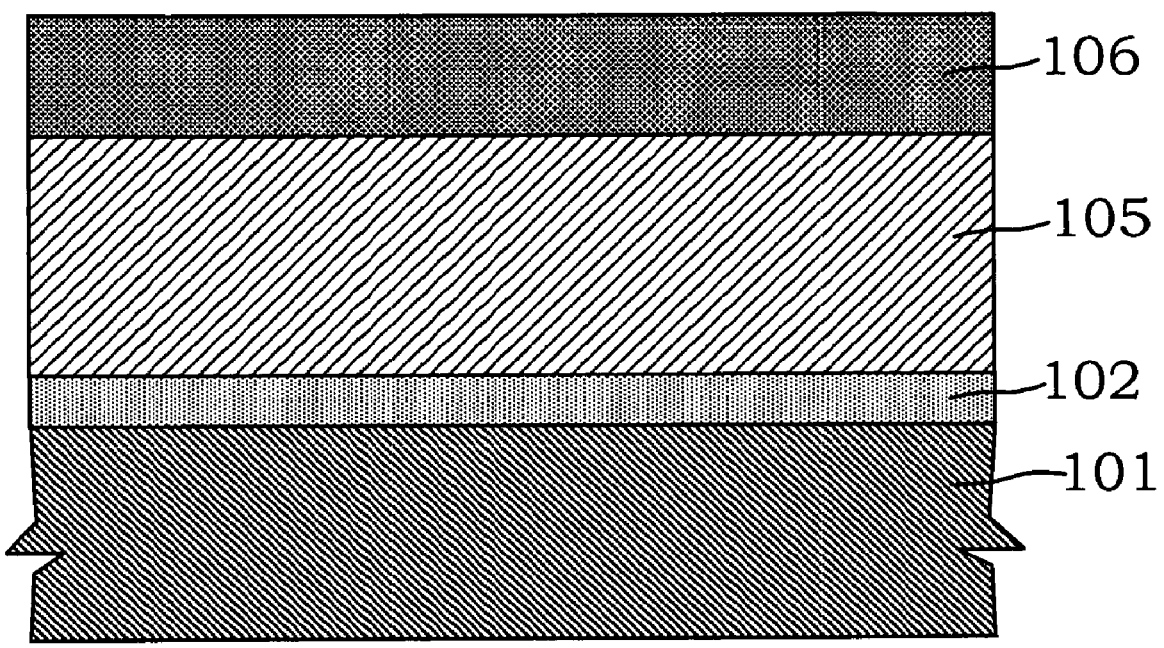

As shown in FIG. 1E, the Ultra High Vacuum Chemical Vapor Deposition (UHVCVD) is used to grow a Ge layer 106 on the relaxed SiGe layer 105 or the SiGe buffer layer 105. It is the doping p plus (p$^+$) layer. The mutual action between the SiGe buffer layer and the dislocation can block the formation of dislocation. The invention can reduce the thickness of the SiGe epitaxial layer. Normally, the thickness of the SiGe epitaxial layer (Si/Ge$_{0.8}$Si$_{0.2}$/Ge$_{0.9}$Si$_{0.1}$/Ge) can be reduced from 10 μm to 0.45 μm.

Figure 2:
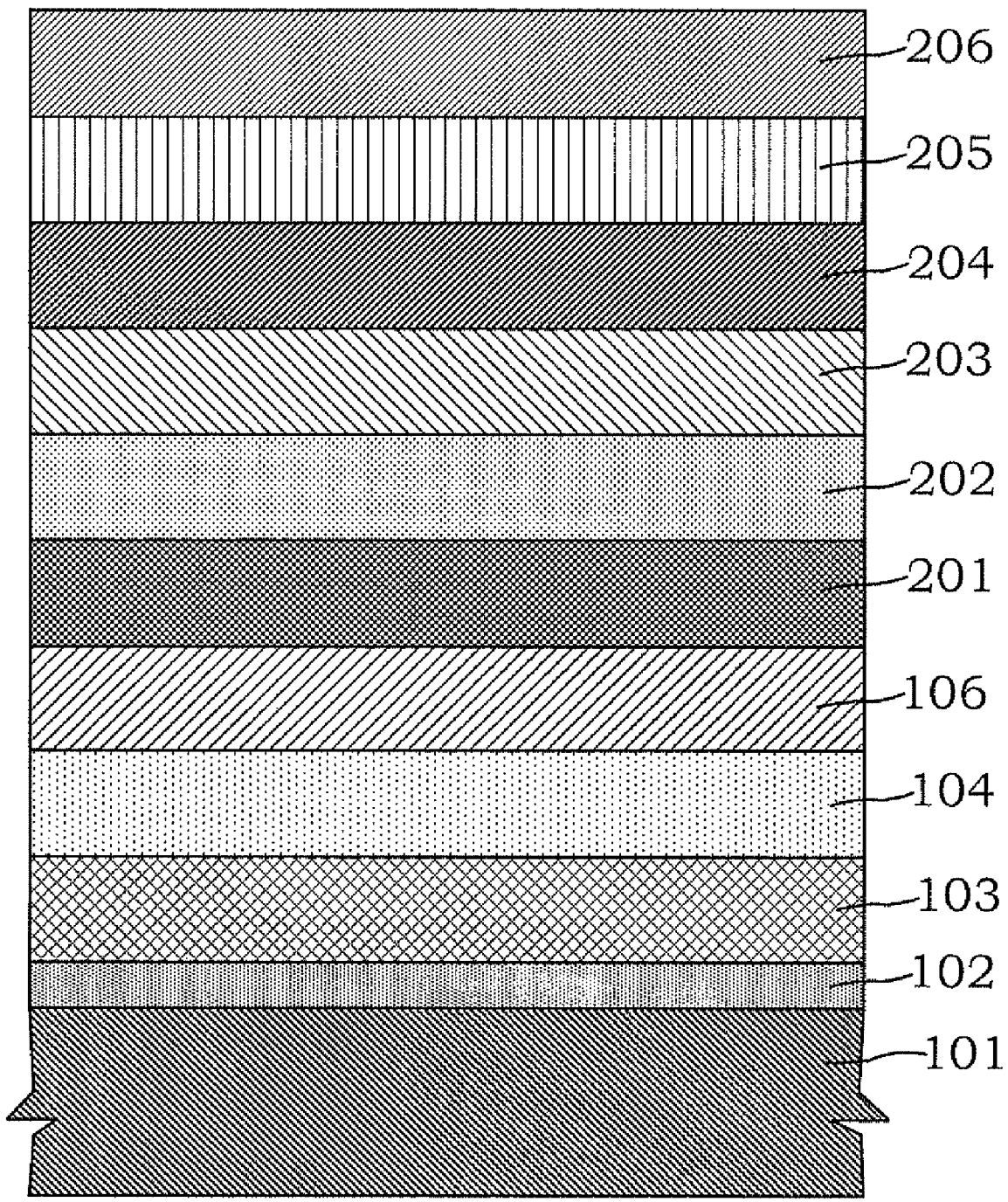
FIG. 2 shows a preferred embodiment of the invention.

As shown in FIG. 2, the Metal Organic Chemical Vapor Deposition (MOCVD) is used to grow the InGaAs layer 201, the InGaP layer 202, the n$^-$ GaAs layer 203, the p$^+$ GaAs layer 204, and the textured InGaAlP layer 205. The solar cell chip can obtain high-efficiency and full-spectrum absorption effect through using texture, quantum well, and multiple-junction epitaxial structure. The Plasma Enhanced Convention Vapor Deposition (PECVD) is used to implant Si$^+$ ion, to increase N-type doping concentration of photovoltaic elements and reduce the interface resistance. The H$^+$ ion is implanted to deactivate the ionization bond. Finally, the Inductively-Coupled Plasma (ICP) is used to deposit a SiN covering layer 206.

The invention is mainly to form the III-V solar cell on the silicon substrate. Before the growth of the SiGe epitaxial layer, the Si$^+$ implantation is used to enhance the stress relaxation at the interface between the silicon substrate and the SiGe epitaxial layer. Then, the relaxed SiGe buffer layer is grown on the silicon substrate. The stress between the interface is used to block the formation and penetration of dislocations, in order to reduce the dislocation density on the metamorphic SiGe buffer layer. The dislocation density on the SiGe epitaxial layer can be reduced to $3\times10^6$/cm$^2$, and the root mean square (RMS) value on Ge surface can reach to 0.38 nm without generating cross hatch pattern. The contact material of P-type electrode is combined at both ends to form the solar cell, to reduce the fabrication cost of III-V high-efficiency solar cell.

Figure 3:
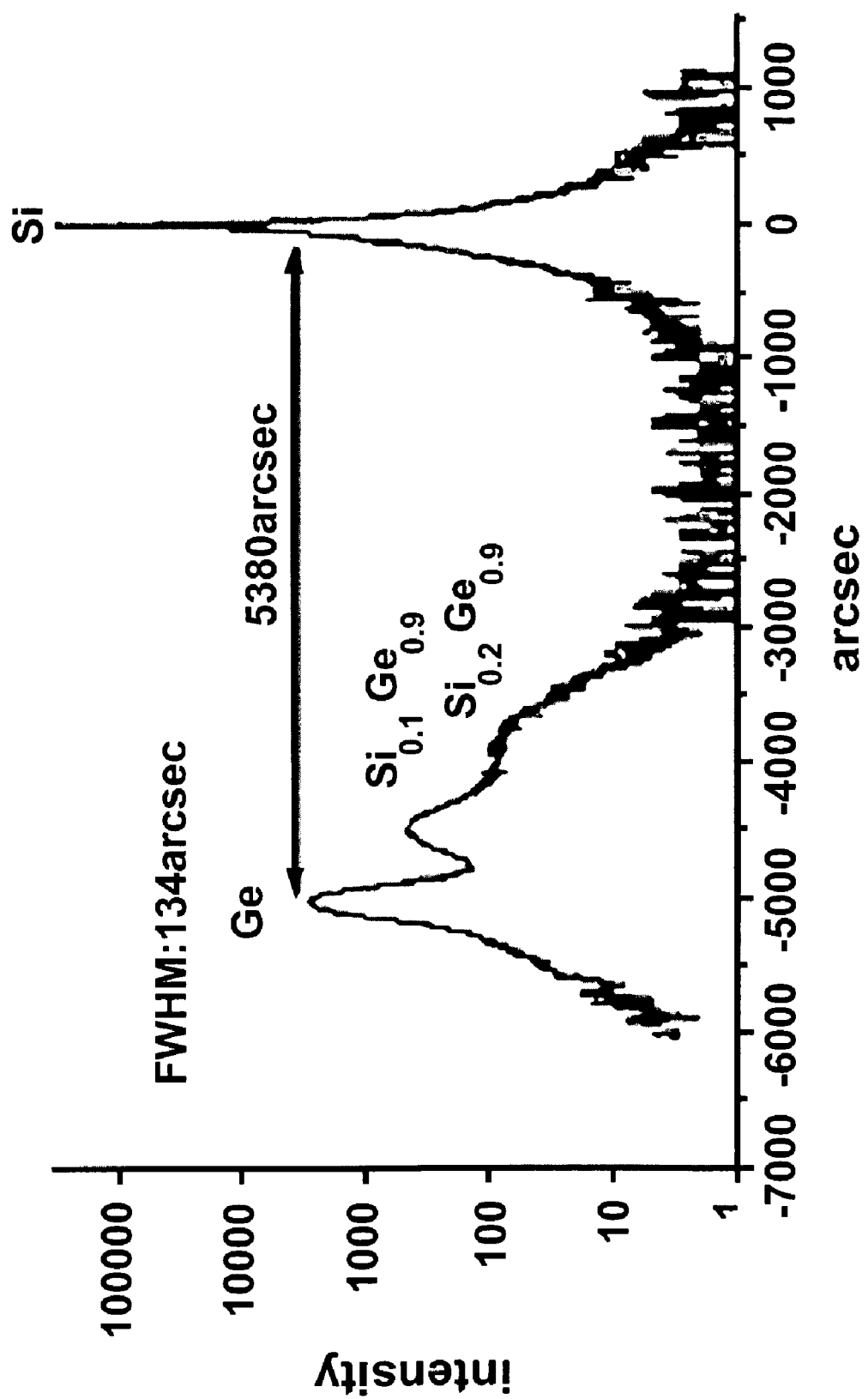
FIG. 3 shows the X-ray diffraction diagram of the invention.

FIG. 3 shows the X-ray diffraction diagram of the invention, which shows the existence of SiGe.

Figure 4A:
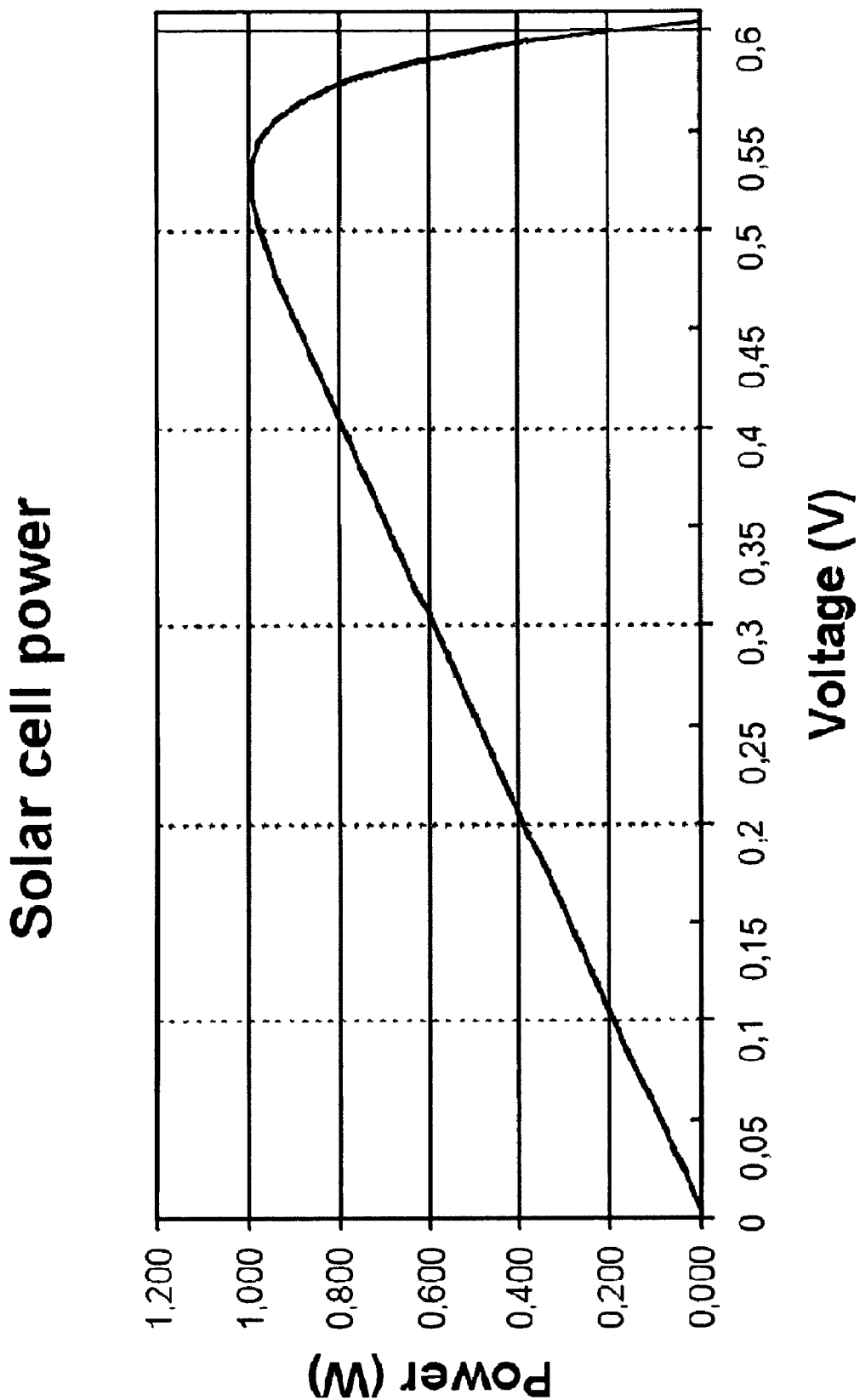
FIG. 4A shows the power performance for the solar cell of the invention.

FIG. 4A shows the power performance for the solar cell of the invention, where the power is the ordinate axis and the voltage is the abscissa axis.

Figure 4B:
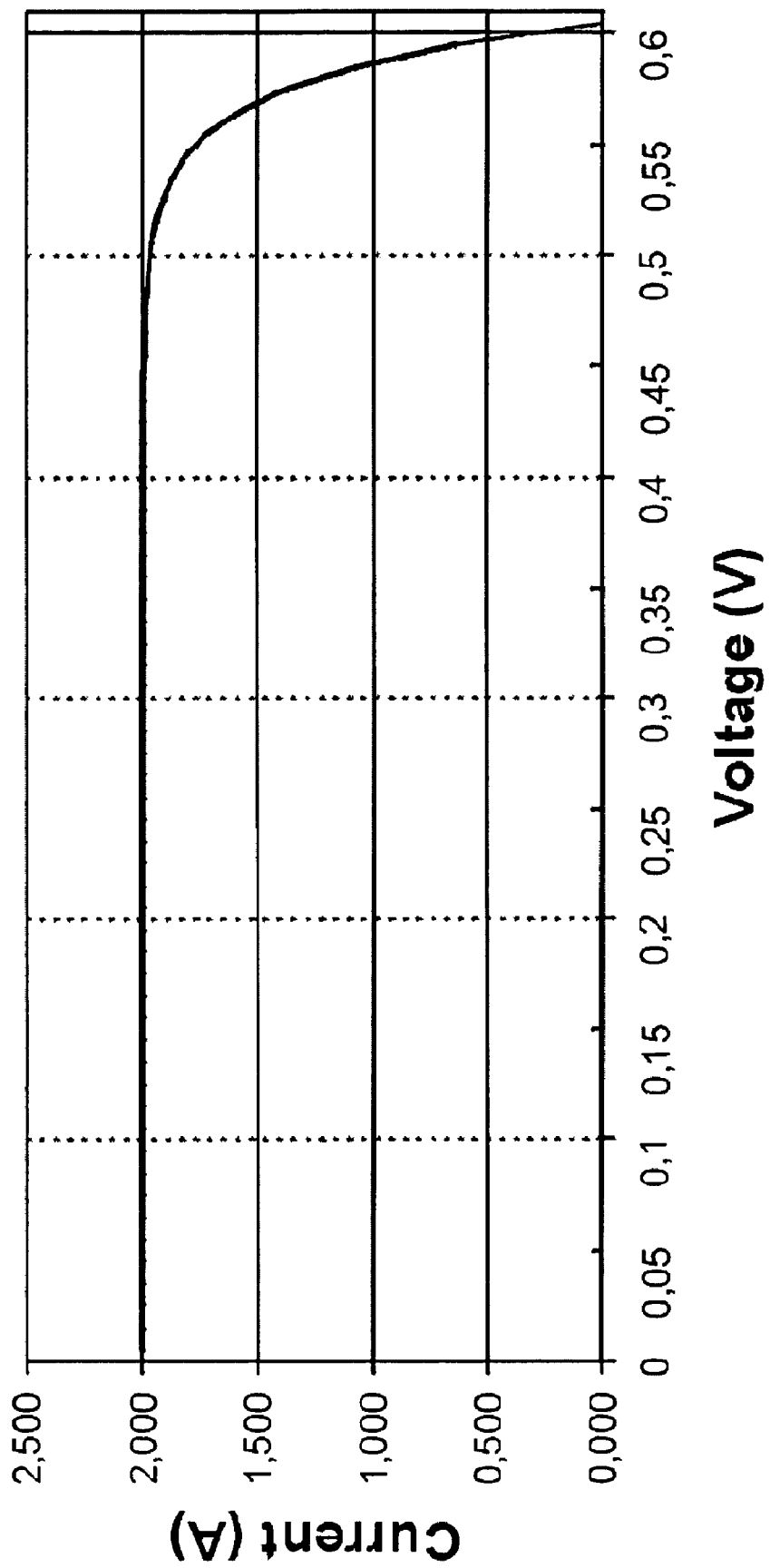
FIG. 4B shows the electric charge performance for the solar cell of the invention.

FIG. 4B shows the electric charge is stored by the solar cell of the invention, where the current is the ordinate axis and the voltage is the abscissa axis.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for forming a solar cell battery on a silicon substrate by using a Si$^+$ ion implantation method, comprising:
   providing a P-type silicon substrate;
   forming a Si$^+$ ion implantation layer on the P-type silicon substrate by using the Si$^+$ ion implantation method;
   forming a doping p$^+$ SiGe buffer layer on the Si$^+$ implantation layer by using a Ultra High Vacuum Chemical Vapor Deposition at twice;
   forming a doping p$^+$ Ge layer on the doping p$^+$ SiGe buffer layer by using a Ultra High Vacuum Chemical Vapor Deposition;
   forming an InGaAs layer on the Ge layer by using a Metal Organic Chemical Vapor Deposition:
   forming an InGaP layer on the InGaAs layer,
   forming a n$^-$ GaAs layer on the InGaP layer;
   forming a p$^+$ GaAs layer on the n$^-$ GaAs layer;
   forming an InGaAlP layer on the p$^+$ GaAs layer; and
   depositing a SiN covering layer on the InGaAlP layer in order to form the solar cell battery.

2. The method for forming a solar cell battery on a silicon substrate according to claim 1, wherein the growth condition of the SiGe buffer layer is about 450° C. and 30 mTorr.

* * * * *